(12) United States Patent  
Iwaki et al.

(10) Patent No.: US 8,368,176 B2  
(45) Date of Patent: Feb. 5, 2013

(54) SEMICONDUCTOR DEVICE AND METHOD OF MANUFACTURING SEMICONDUCTOR DEVICE

(75) Inventors: Takayuki Iwaki, Kanagawa (JP); Takamasa Itou, Kanagawa (JP); Kana Shimizu, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/157,020

(22) Filed: Jun. 9, 2011

(65) Prior Publication Data

US 2011/0304017 A1 Dec. 15, 2011

(30) Foreign Application Priority Data

Jun. 10, 2010 (JP) ................................. 2010-133356

(51) Int. Cl.  
*H01L 29/00* (2006.01)

(52) U.S. Cl. ......... 257/532; 257/303; 257/535; 438/381

(58) Field of Classification Search .................. 257/532, 257/303, 535, E29.342, E21.008; 438/381  
See application file for complete search history.

(56) References Cited

U.S. PATENT DOCUMENTS

| 7,446,362 B2 * | 11/2008 | Hidaka et al. ................ 257/295 |
| 7,633,107 B2 * | 12/2009 | Matsuura ...................... 257/295 |
| 2007/0131997 A1 | 6/2007 | Ohtsuka et al. |
| 2009/0316332 A1 | 12/2009 | Okubo et al. |

FOREIGN PATENT DOCUMENTS

| JP | 2007-158222 A | 6/2007 |
| JP | 2008-288408 A | 11/2008 |
| JP | 2010-003742 A | 1/2010 |

* cited by examiner

*Primary Examiner* — Theresa T Doan  
(74) *Attorney, Agent, or Firm* — Sughrue Mion, PLLC

(57) ABSTRACT

A lower electrode includes a metal-containing oxide layer having a thickness of 2 nm or less on the surface layer. A metal-containing oxide layer is formed by oxidizing the surface of the lower electrode. A dielectric film includes a first phase appearing at room temperature in the bulk state and a second phase appearing at a higher temperature than that in the first phase in the bulk state. The second phase has a higher relative permittivity than that of the first phase.

9 Claims, 10 Drawing Sheets

SEMICONDUCTOR DEVICE AND METHOD OF MANUFACTURING SEMICONDUCTOR DEVICE

The application is based on Japanese patent application No. 2010-133356, the content of which is incorporated herein by reference.

BACKGROUND

1. Technical Field

The present invention relates to a semiconductor device including a capacitive element and a method of manufacturing the semiconductor device.

2. Related Art

Capacitive elements are often incorporated in semiconductor devices. Since miniaturization of semiconductor devices has progressed in recent years, it has become necessary to increase the capacitance of the capacitive element without increasing the planar shape thereof. For example, Japanese Unexamined Patent Publication No. 2008-288408 and Japanese Unexamined Patent Publication No. 2007-158222 disclose that the capacitive element is formed in a three-dimensional type in order to increase the capacitance of the capacitive element.

In addition, in order to increase the capacitance of the capacitive element without increasing the area thereof, the thickness of the capacitive dielectric film may be reduced, or the relative permittivity of a capacitive dielectric film may be made high. However, when the thickness of the capacitive dielectric film is excessively reduced, the leakage current increases.

On the other hand, a technique of Japanese Unexamined Patent Publication No. 2008-288408 discloses that the dielectric constant of the dielectric film can be made high by adding Y or La to the dielectric film.

In addition, Japanese Unexamined Patent Publication No. 2007-158222 discloses that the capacitive dielectric film becomes amorphous by forming the upper layer of a lower electrode out of an amorphous titanium nitride film. According to Japanese Unexamined Patent Publication No. 2008-288408, it is possible to suppress the leakage current while making the relative permittivity of the capacitive dielectric film high by forming such a structure.

Meanwhile, Japanese Unexamined Patent Publication No. 2010-3742 discloses that the surface layer portion of a TiN film is made amorphous or microcrystalline in order to improve flatness of the TiN film which is a lower electrode of the capacitive element.

As mentioned above, in order to miniaturize the semiconductor device, it is necessary to increase the capacitance of the capacitive element without increasing the planar shape thereof. At this time, it is also necessary to suppress the increase in the leakage current of the capacitive element.

SUMMARY

The inventor focuses attention on the fact that a metal oxide film used as the capacitive dielectric film includes a plurality of phases and the dielectric constant of a phase appearing at high temperature is higher than the dielectric constant of a phase appearing at room temperature, and has reached the creation of the invention.

In one embodiment, there is provided a semiconductor device including: a substrate; a transistor formed in the substrate; a multilayer interconnect layer formed over the substrate and the transistor; and a capacitive element formed in the multilayer interconnect layer, wherein the capacitive element includes a lower electrode including a metal, a dielectric film, formed over the lower electrode, which is made of a metal oxide film, and an upper electrode formed over the dielectric film, the lower electrode includes an oxide layer having a thickness of 2 nm or less over the surface layer, the dielectric film includes at least a first phase appearing at room temperature in the bulk state and a second phase appearing at a higher temperature than that in the first phase in the bulk state, and the second phase has a higher relative permittivity than that of the first phase.

According to the invention, the lower electrode including a metal includes an oxide layer having a thickness of 2 nm or less on the surface layer. In this case, the dielectric film includes a first phase appearing at room temperature in the bulk state and a second phase appearing at a higher temperature than that in the first phase in the bulk state. The second phase has a higher relative permittivity than that of the first phase. For this reason, even when the thickness of the dielectric film is not reduced, it is possible to increase the capacitance of the capacitive element. In addition, since it is not necessary to reduce the thickness of the dielectric film more than necessary, it is possible to suppress the increase in the leakage current of the capacitive element.

In another embodiment, there is provided a method of manufacturing a semiconductor device, including: forming a transistor in a substrate; and forming a multilayer interconnect layer and a capacitive element located in the multilayer interconnect layer over the substrate and the transistor, wherein the step of forming the capacitive element includes forming a lower electrode including a metal, forming an amorphous metal-containing oxide layer over the surface of the lower electrode, annealing and crystallizing the metal-containing oxide layer, forming a dielectric film made of a metal oxide film over the metal-containing oxide layer, and annealing the dielectric film, and forming an upper electrode over the dielectric film.

In still another embodiment, there is provided a method of manufacturing a semiconductor device including: forming a transistor in a substrate; and forming a multilayer interconnect layer and a capacitive element located in the multilayer interconnect layer over the substrate and the transistor, wherein the step of forming the capacitive element includes forming a lower electrode including a metal, processing the surface of the lower electrode using oxidizing plasma in a state where the substrate is maintained at a temperature of 100° C. or lower, annealing the lower electrode, forming a dielectric film made of a metal oxide film over the lower electrode, and annealing the dielectric film, and forming an upper electrode over the dielectric film.

According to the invention, it is possible to increase the capacitance of the capacitive element without increasing the planar shape thereof, and to suppress the increase in the leakage current of the capacitive element.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF REFERENCE NUMERALS AND SIGNS

Detailed Description

Figure 1:
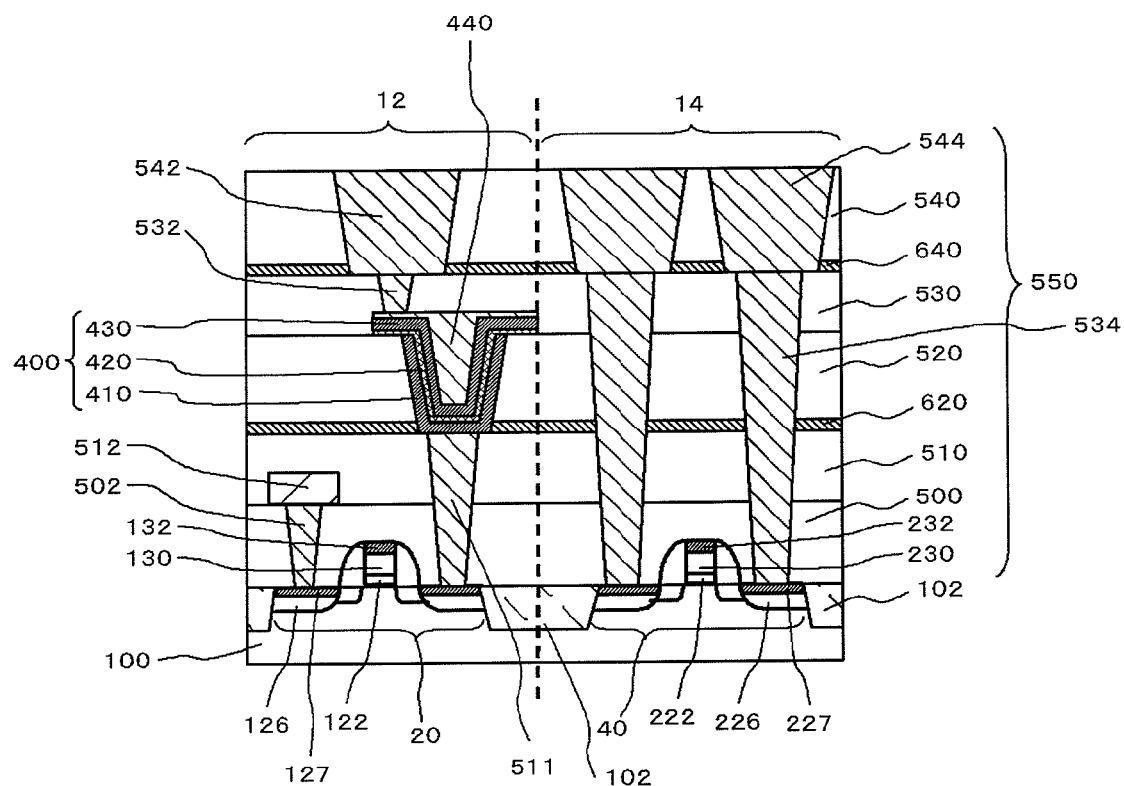
FIG. 1 is a cross-sectional view illustrating the configuration of a semiconductor device according to an embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, the embodiment of the invention will be described with reference to the accompanying drawings. In all the drawings, like elements are referenced by like reference numerals and descriptions thereof will not be repeated.

Figure 2:
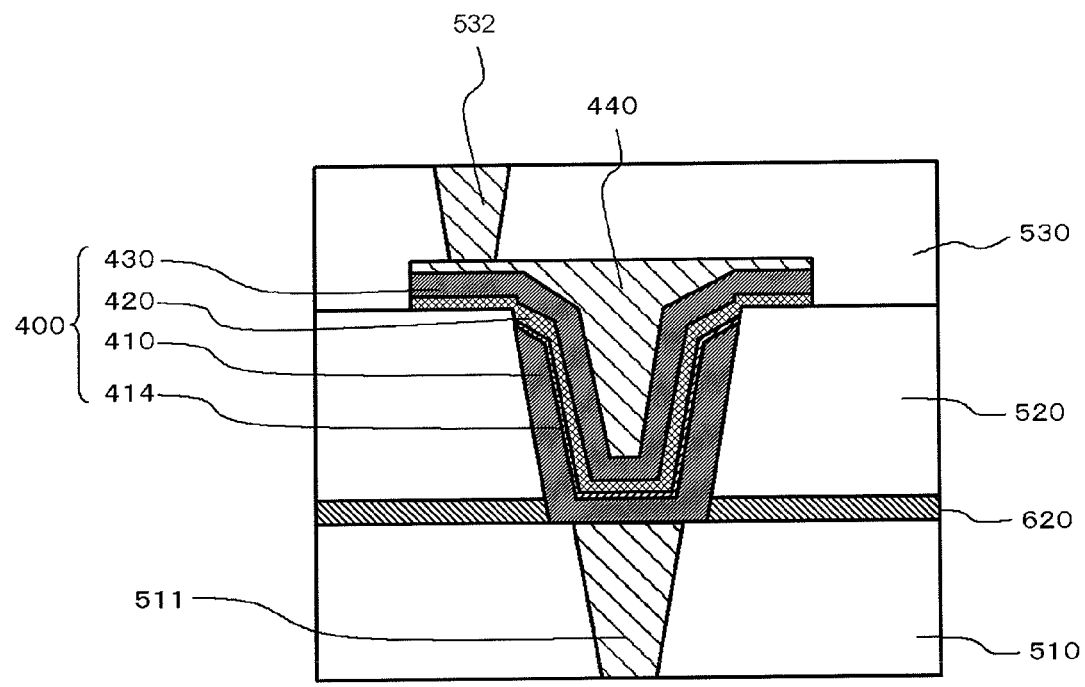
FIG. 2 is a cross-sectional view illustrating the configuration of a capacitive element shown in FIG. 1.

FIG. 1 is a cross-sectional view illustrating the configuration of a semiconductor device according to an embodiment. FIG. 2 is a cross-sectional view illustrating the configuration of a capacitive element 400 shown in FIG. 1. This semiconductor device includes a substrate 100, a transistor 40, a multilayer interconnect layer 550, and a capacitive element 400. The substrate 100 is a semiconductor substrate made of silicon and the like. The transistor 40 is formed in the substrate 100. The multilayer interconnect layer 550 is formed on the substrate 100 and the transistor 40. The capacitive element 400 is formed in the multilayer interconnect layer 550.

The capacitive element 400 includes a lower electrode 410, a dielectric film 420, and an upper electrode 430. As shown in FIG. 2, the lower electrode 410 includes a metal-containing oxide layer 414 having a thickness of 2 nm or less on the surface layer. The metal-containing oxide layer 414 is formed by oxidizing the surface of the lower electrode 410. The dielectric film 420 includes at least a first phase appearing at room temperature in the bulk state and a second phase appearing at a higher temperature than that in the first phase in the bulk state. The second phase has a higher relative permittivity than that of the first phase. Here, the fact that in the bulk state, the first phase appears at room temperature and the second phase appears at a higher temperature than that in the first phase means that in the phase equilibrium diagram in the bulk, the crystal phase of the first phase transitions to the crystal phase of the second phase in the phase transition when the temperature rises. That is, the dielectric film 420 has the crystal phase of the first phase at a temperature lower than the phase transition temperature, and is formed of a material of physical properties which becomes the crystal phase of the second phase at a temperature higher than the phase transition temperature. As the dielectric film 420, for example, zirconium oxide ($ZrO_2$) is exemplified. In $ZrO_2$, the first phase is a monoclinic phase, and transitions to a tetragonal phase which is the second phase in the phase transition at high temperature. Meanwhile, in $ZrO_2$, the first phase transitions to a cubic phase at a higher temperature. Hereinafter, detailed description will be made.

In the example shown in FIG. 1, in the semiconductor device, a memory circuit 14 and the memory circuit 12 are incorporated with each other. The transistor 40 is a portion of the memory circuit 14, and the capacitive element 400 is a portion of a memory cell. An element isolation film 102 is formed between the memory circuit 14 and the memory circuit 12.

The transistor 40 includes a gate insulating film 222, a gate electrode 230, and a diffusion layer 226 serving as a source and drain. A silicide layer 232 is formed on the surface of the gate electrode 230, and a silicide layer 227 is formed on the surface of the diffusion layer 226. In addition, an extension region is formed in the periphery of the diffusion layer 226.

The memory circuit 12 further includes a transistor (not shown) for reading and writing. This transistor has the same configuration as that of a transistor 20 formed in a logic region. The transistor 20 includes a gate insulating film 122, a gate electrode 130, and a diffusion layer 126 serving as a source and drain. A silicide layer 132 is formed on the surface of the gate electrode 130, and a silicide layer 127 is formed on the surface of the diffusion layer 126. In addition, an extension region is formed in the periphery of the diffusion layer 126.

The multilayer interconnect layer 550 includes insulating layers 500, 510, 520, 530, and 540. The insulating layers 500, 510, 520, 530, and 540 are films containing, for example, $SiO_2$ or SiOC as a main component, and are laminated on the substrate 100 in this order. A bit line 512 is formed on the insulating layer 500. The bit line 512 is connected to the diffusion layer 126 at one side of the transistor 20 through a contact 502 buried in the insulating layer 500. Meanwhile, the diffusion layer 126 at the other side of the transistor 20 is connected to the lower electrode 410 of the capacitive element 400 through a contact 511. The contact 511 is buried in the insulating layers 500 and 510.

An etching stopper film 620 is formed between the insulating layer 510 and the insulating layer 520. The etching stopper film 620 is, for example, a SiON film. The three-dimensional type, for example, a cylindrical type capacitive element 400 is buried in the insulating layer 520.

The capacitive element 400 is a three-dimensional type, and is buried in an opening which is formed in the insulating layer 520. The lower electrode 410 is, for example, a Ti nitride film, and the thickness thereof is, for example, equal to or more than 5 nm and equal to or less than 50 nm. Meanwhile, as the lower electrode 410, Ta nitride and Zr nitride can be used. Further, as the lower electrode 410, Ru, Ti, Ta, and Zr can be used. The dielectric film 420 is, for example, a zirconium oxide film or a hafnium oxide film, and the thickness thereof is, for example, equal to or more than 6 nm and equal to or less than 10 nm. The upper electrode 430 is, for example, a Ti nitride film, and the thickness thereof is, for example, equal to or more than 10 nm and equal to or less than 75 nm. A buried metal film 440 is formed on the upper electrode 430. The buried metal film 440 is buried in a region which is not buried by the capacitive element 400 in the opening formed in the insulating layer 520. The buried metal film 440 is in ohmic contact with the upper electrode 430, and is formed of a metal having a good burial property, for example, tungsten.

Interconnects 542 and 544 are formed in the insulating layer 540. The interconnect 542 is connected to the upper electrode 430 of the capacitive element 400 through a via 532 and the buried metal film 440. The via 532 is buried in the insulating layer 530. Meanwhile, an etching stopper film 640 is formed between the insulating layer 530 and the insulating layer 540. In addition, the interconnect 544 is connected to the diffusion layer 226 of the transistor 40 through a contact 534 and the silicide layer 227.

As mentioned above, the metal-containing oxide layer 414 is formed on the surface of the lower electrode 410 of the capacitive element 400. Since the thickness of the metal-containing oxide layer 414 is 2 nm or less, the crystal structure thereof is microcrystalline. For this reason, when the dielectric film 420 is formed on the metal-containing oxide layer 414, at least the second phase as well as the first phase is formed in the dielectric film 420. When the dielectric film 420 is a zirconium oxide film or a hafnium oxide film, the first phase is a monoclinic phase, and the second phase is, for example, a tetragonal phase, but they may be a cubic phase. The cubic phase is a more stable phase at high temperature than the tetragonal phase, but the second phase in the embodiment is preferably a tetragonal phase because the tetragonal phase has a higher dielectric constant than that of the cubic phase. Meanwhile, the dielectric film 420 may include phases other than the first phase and the second phase. For example, when the dielectric film 420 is a zirconium oxide film or a hafnium oxide film, the dielectric film 420 may be a mixed crystal of the monoclinic phase, the tetragonal phase, and a cubic phase.

In addition, the dielectric film 420 includes the second phase at equal to or more than 0.2 times that of the first phase for conversion into a dielectric constant. Here, the conversion into a dielectric constant means that the relative permittivity of the dielectric film 420 is calculated from the capacitance of the capacitive element 400, and the ratio of the first phase to the second phase is set so that the relative permittivity of the dielectric film 420 is equivalent to the calculated value. Meanwhile, in this calculation processing, in each of the relative permittivities of the first phase and the second phase, the relative permittivities in the bulk state are used. That is, when the relative permittivity of the dielectric film 420 is set to $\epsilon 1$, the relative permittivity of the first phase in the bulk is set to $\epsilon 2$, and the relative permittivity of the second phase in the bulk is set to $\epsilon 3$, the ratio y of the second phase to the first phase in the dielectric film 420 is calculated by the following Expression (1).

$$y=(\epsilon_1-\epsilon_2)/(\epsilon_3-\epsilon_1) \quad (1)$$

The method of manufacturing the semiconductor device shown in FIG. 1 includes the following steps. First, the transistors 20 and 40 are formed in the substrate 100. Next, the multilayer interconnect layer 550 and the capacitive element 400 are formed on the substrate 100 and the transistors 20 and 40. The step of forming the capacitive element 400 includes the following steps. First, the lower electrode 410 is formed. Next, in the state where the substrate is maintained at a temperature of 100° C. or lower, the surface of the lower electrode 410 is processed using oxidizing plasma. In this processing, an amorphous metal-containing oxide layer 412 is formed on the surface of the lower electrode 410 with a thickness of 2 nm or less. Next, the metal-containing oxide layer 412 is annealed. The metal-containing oxide layer 412 is crystallized by annealing the metal-containing oxide layer 412, and becomes the microcrystalline metal-containing oxide layer 414. Next, the dielectric film 420 is formed on the lower electrode 410. Next, the dielectric film 420 is annealed, and the upper electrode 430 is formed on the dielectric film 420. Hereinafter, a method of manufacturing the capacitive element 400 will be described in detail with reference to the cross-sectional views of FIGS. 3 to 8.

Figure 3:
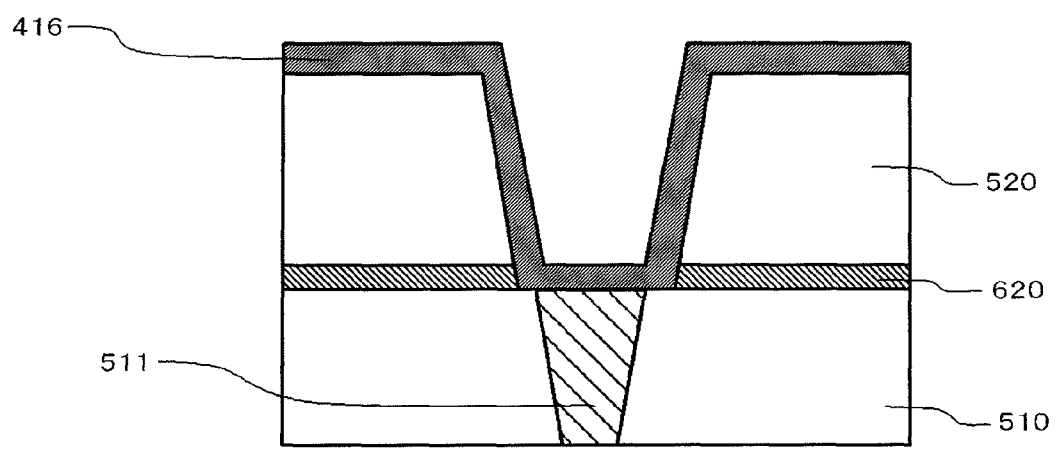
FIG. 3 is a cross-sectional view illustrating a method of manufacturing the capacitive element.

As shown in FIG. 3, the contact 511 is formed in the insulating layer 510. The etching stopper film 620 and the insulating layer 520 are formed on the insulating layer 510. Next, a mask pattern (not shown) is formed on the insulating layer 520, and the insulating layer 520 and the etching stopper film 620 are etched in this order using this mask pattern as a mask. When the insulating layer 520 is etched, the etching stopper film 620 becomes an etching stopper, and when the etching stopper film 620 is etched, the insulating layer 510 becomes an etching stopper. Thereby, an opening (hole) for forming the capacitive element 400 is formed. The upper surface of the contact 511 is exposed at the bottom of the opening.

Thereafter, the mask pattern is removed. Next, a lower electrode film 416 is formed on the insulating layer 510, and on the lateral side and the bottom of the opening by, for example, a reactive sputtering method or a sputtering method.

Figure 4:
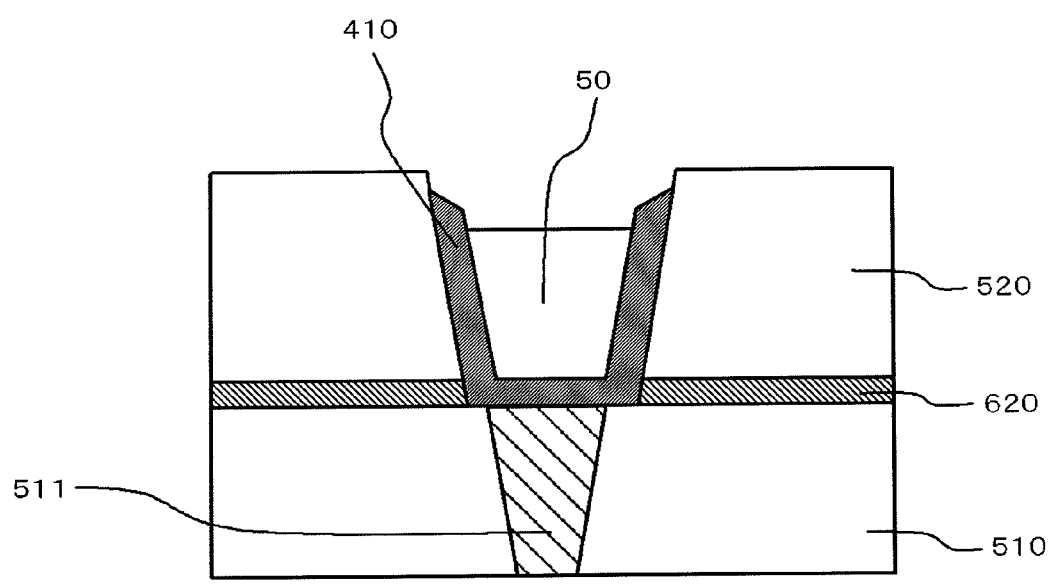
FIG. 4 is a cross-sectional view illustrating the method of manufacturing the capacitive element.

Next, as shown in FIG. 4, the lower electrode film 416 located within the opening is covered with a resist pattern 50. Next, the lower electrode film 416 is etched using the resist pattern 50 as a mask. Thereby, the lower electrode film 416 is selectively removed, and the lower electrode 410 is formed.

Figure 5:
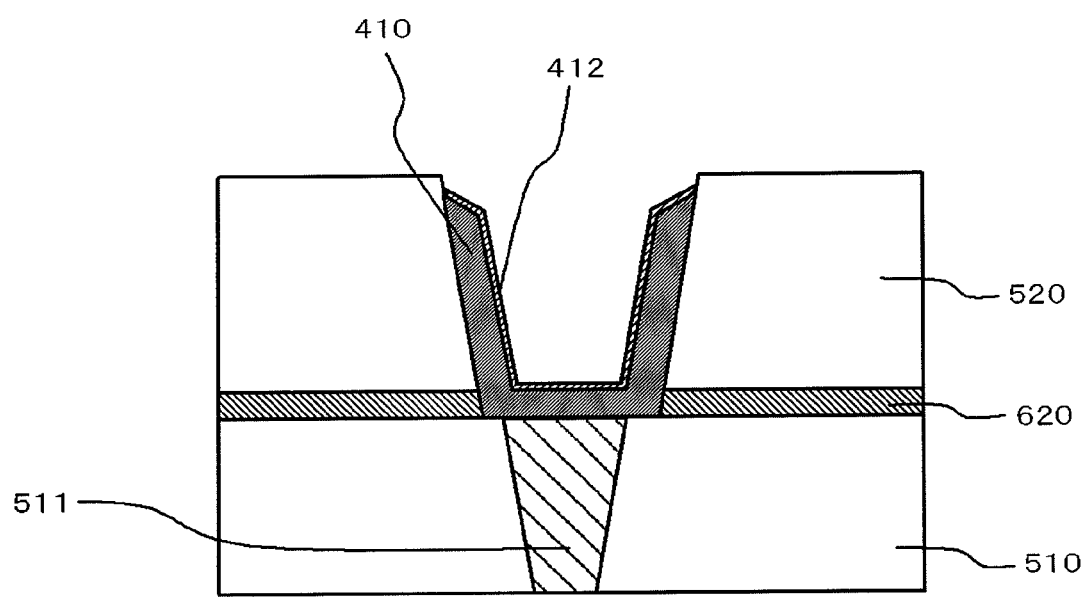
FIG. 5 is a cross-sectional view illustrating the method of manufacturing the capacitive element.

Next, as shown in FIG. 5, the resist pattern 50 is removed. At this time, the resist pattern 50 is asked using the oxidizing plasma, for example, oxygen plasma. The oxygen plasma herein may be plasma of only $O_2$, or may have an inert gas, for example, Ar or $N_2$ which easily enters a plasma state in addition to $O_2$. In the asking processing, the temperature of the substrate 100 (see FIG. 1) is maintained at 100° C. or less, preferably at 40° C. or lower. Thereby, the extremely thin portion of the surface layer of the lower electrode 410 is altered and oxidized, and the amorphous metal-containing oxide layer 412, for example, $TiO_x$ is formed. Here, the term "amorphous" means that the film becomes a halo pattern in electron diffraction. The thickness of the metal-containing oxide layer 412 is, for example, 2 nm or less, and is a thickness of 0.5 nm or more or one or more atomic layers of Ti.

Figure 6:
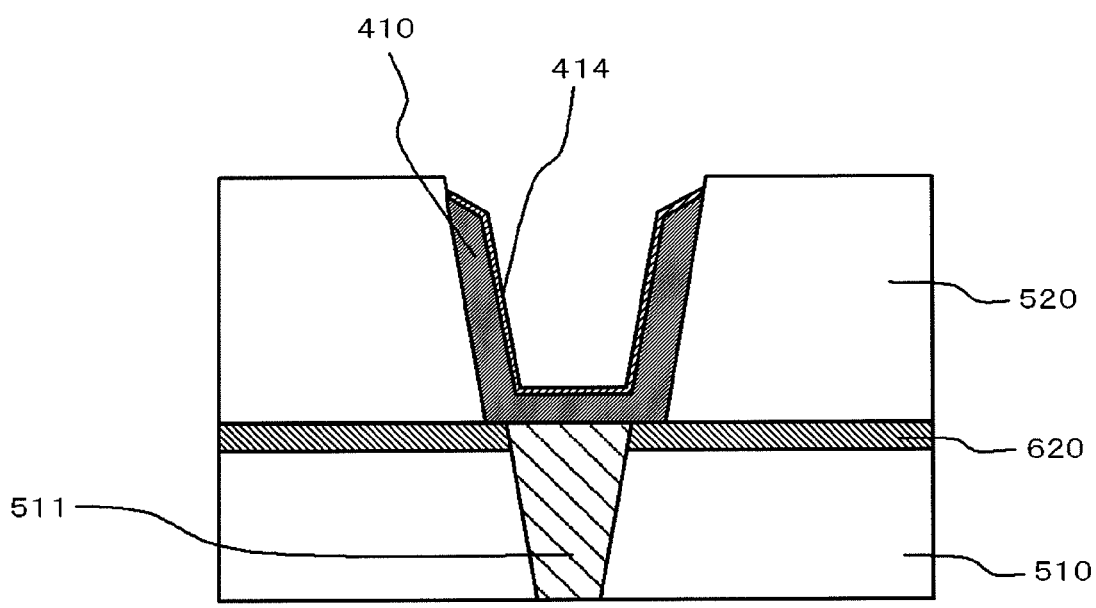
FIG. 6 is a cross-sectional view illustrating the method of manufacturing the capacitive element.

Next, as shown in FIG. 6, in an atmosphere in which reaction with the metal-containing oxide layer 412 is not caused, for example, a nitrogen atmosphere or an atmosphere of rare gases such as Ar, the metal-containing oxide layer 412 is annealed. Thereby, the amorphous metal-containing oxide layer 412 is crystallized, and becomes the metal-containing oxide layer 414 in the microcrystalline state. The annealing temperature at this time is set so that the temperature of the substrate 100 is equal to or higher than 300° C. and equal to or lower than 500° C., preferably equal to or higher than 350° C. and equal to or lower than 450° C. Meanwhile, when the temperature of the substrate 100 exceeds 500° C., there is a possibility of affecting the characteristics of the transistors 20 and 40.

Figure 7:
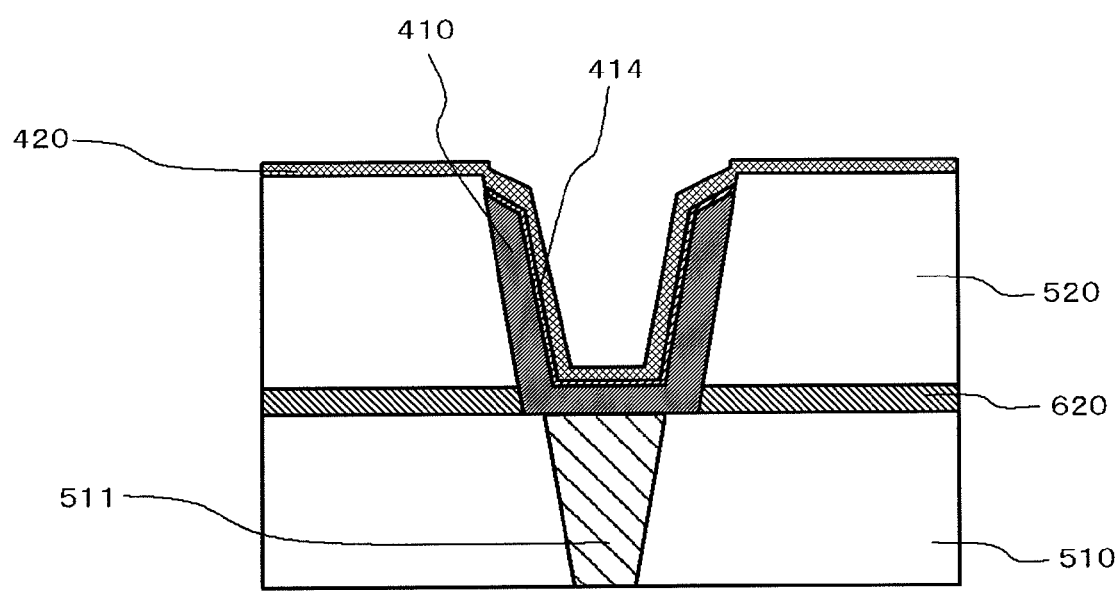
FIG. 7 is a cross-sectional view illustrating the method of manufacturing the capacitive element.

Next, as shown in FIG. 7, the dielectric film 420 is formed on the metal-containing oxide layer 414 of the lower electrode 410 using, for example, an atomic layer deposition (ALD) method. At this time, the dielectric film 420 may be grown on the insulating layer 520, and may be selectively grown on the metal-containing oxide layer 414. In addition, at this time, the substrate 100 is preferably heated to, for example, equal to or higher than 200° C. and equal to or lower than 300° C.

Figure 8:
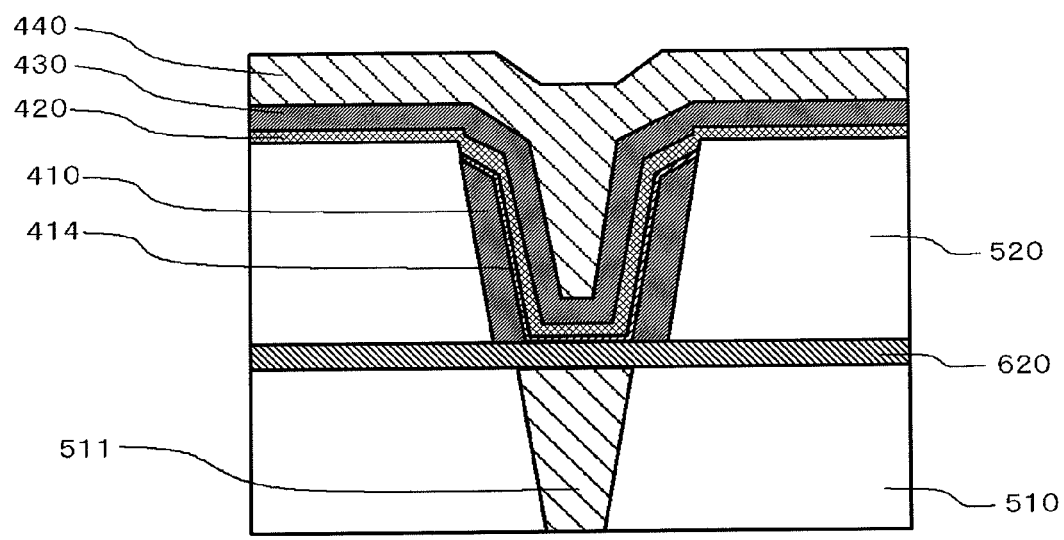
FIG. 8 is a cross-sectional view illustrating the method of manufacturing the capacitive element.

Next, as shown in FIG. 8, the upper electrode 430 and the buried metal film 440 are formed on the dielectric film 420 in this order. In the step of forming the upper electrode 430, the substrate 100 is heated to equal to or higher than 300° C. and equal to or lower than 500° C., preferably equal to or higher than 350° C. and equal to or lower than 450° C. By this annealing, the second phase appears in the dielectric film 420, for example, at equal to or more than 0.2 times that of the first phase besides the first phase.

Meanwhile, for the purpose of adding a sufficient heat history to the dielectric film 420, before the upper electrode 430 is formed, the annealing may be performed on the dielectric film 420 by heating the substrate 100 to equal to or higher than 300° C. and equal to or lower than 500° C., preferably equal to or higher than 350° C. and equal to or lower than 450° C.

In addition, the substrate 100 is not heated in the step of forming the upper electrode 430, and instead, before the upper electrode 430 is formed, the annealing may be performed on the dielectric film 420 by heating the substrate 100 to equal to or higher than 300° C. and equal to or lower than 500° C., preferably equal to or higher than 350° C. and equal to or lower than 450° C.

Thereafter, the capacitive element 400 and the buried metal film 440 are formed by removing the unnecessary portion in the dielectric film 420, the upper electrode 430, and the buried metal film 440.

Next, an operation and an effect of the embodiment will be described. In the embodiment, the lower electrode 410 including Ti includes the metal-containing oxide layer 414 having a thickness of 2 nm or less on the surface layer thereof. In this case, the dielectric film 420 includes the first phase appearing at room temperature in the bulk state and the second phase appearing at a higher temperature than that in the first phase in the bulk state. The second phase has a higher relative permittivity than that of the first phase. For this reason, even when the thickness of dielectric film 420 is not reduced, the capacitance of the capacitive element 400 can be increased. In addition, since it is not necessary to reduce the thickness of the dielectric film 420 more than necessary, it is possible to suppress the increase in the leakage current of the capacitive element 400.

Moreover, in the materials of the dielectric film 420, when the current is leaked more easily in the second phase than in the first phase, and the dielectric film 420 is in the state where the first phase and the second phase are mixed as in the embodiment, the leakage current becomes smaller than in the case of a single second phase. In addition, since it is not necessary to use high-cost materials such as rare earths, the increase in the costs can be suppressed. In addition, since the change from existing processes is small, the increase in the costs can be suppressed.

In addition, the thickness of the metal-containing oxide layer 414 is 2 nm or less. In general, the metal-containing oxide layer is formed on the lower electrode 410 by the asking processing of the resist pattern 50, but the thickness thereof is 3 nm or more. Since the sheet resistance of the metal oxide is high, it is possible to lower the resistance of the lower electrode 410 when the thickness of the metal-containing oxide layer 414 is reduced as in the embodiment.

Figure 9:
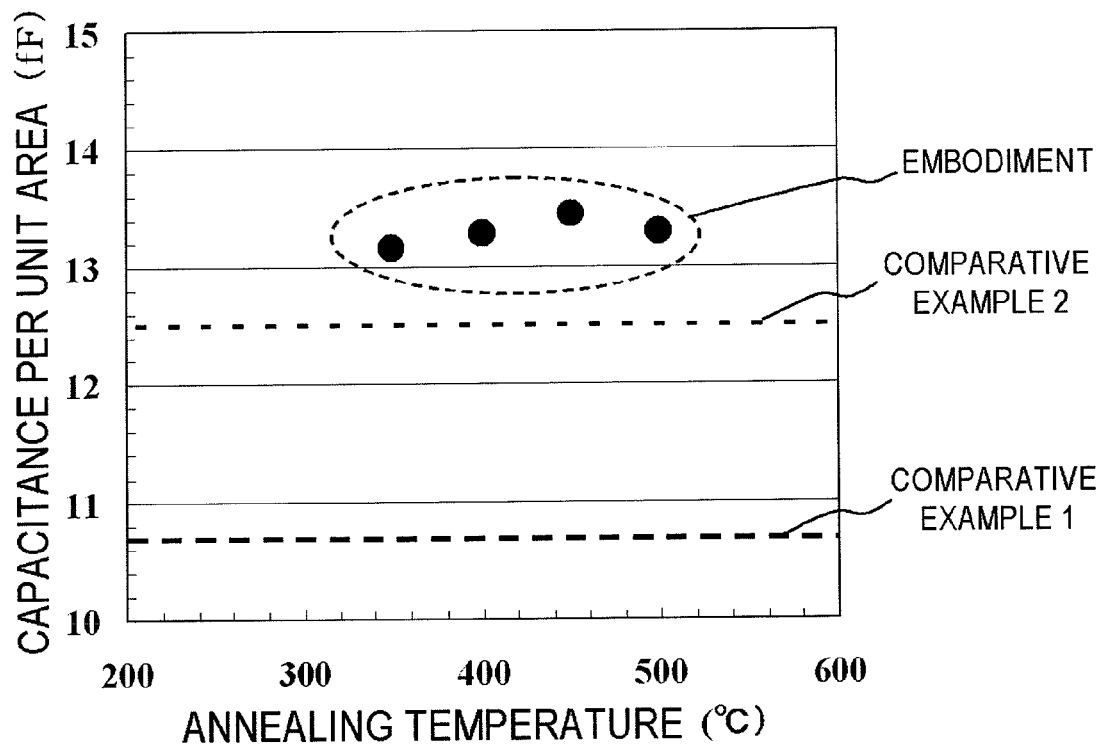
FIG. 9 is a diagram obtained by comparing the capacitance per unit area of the capacitive element according to the embodiment with those of the capacitive elements in Comparative Examples.

FIG. 9 is a diagram obtained by comparing the capacitance per unit area of the capacitive element according to the embodiment with those of the capacitive elements in Comparative Examples. The horizontal axis indicates a temperature of the substrate 100 in the annealing shown in FIG. 6.

The capacitive element in Comparative Example 1 is formed by the same method as that of the embodiment with the exception that the temperature of the substrate 100 in the removal processing of the resist pattern 50 shown in FIG. 5 is set to a temperature of 250° C. and the annealing shown in FIG. 6 is omitted. In addition, the capacitive element in Comparative Example 2 is formed by the same method as that of the embodiment with the exception that the annealing shown in FIG. 6 is omitted.

The capacitive element in Comparative Example 1 had a maximum value of the capacitance per unit area of 10.7 fF. In addition, the capacitive element in Comparative Example 2 had a maximum value of the capacitance per unit area of 12.5 fF. On the other hand, when the temperature of the substrate 100 in the annealing was in any range of 350° C. to 500° C., the capacitive element according to the embodiment exceeded the capacitance per unit area of 13 fF. Therefore, it was shown that the capacitance of the capacitive element according to the embodiment was large.

Figure 10:
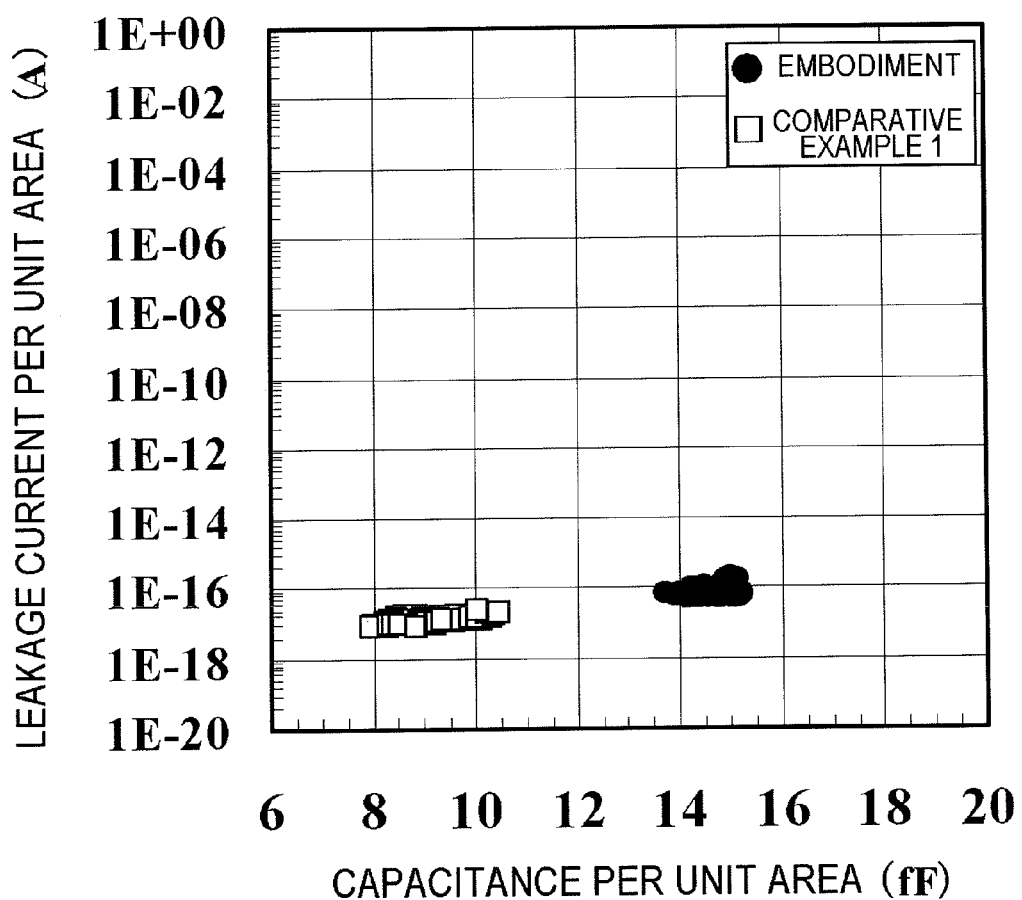
FIG. 10 is a graph illustrating the relationship between the amount of the leakage current and the capacitance per unit area of the capacitive element according to the embodiment and those of the capacitive element in Comparative Example 1.

FIG. 10 is a graph illustrating the relationship between the amount of the leakage current and the capacitance per unit area of the capacitive element according to the embodiment and those of the capacitive element in Comparative Example 1 shown in FIG. 9. As mentioned above, the capacitive element according to the embodiment has a larger capacitance per unit area than that of the capacitive element in Comparative Example 1. In addition, the capacitive element according to the embodiment has the amount of the leakage current per unit area of $2 \times 10^{-16}$ A or less, and thus the charge retention characteristics thereof have a necessary performance.

Meanwhile, in the example shown in FIG. 1, although the capacitive element 400 is used as a capacitance of the memory cell, the capacitive element 400 may be used as an analog circuit, for example, a capacitive element for decoupling. In addition, the capacitive element 400 may be a plane type.

As described above, although the embodiments of the invention have been set forth with reference to the drawings, they are merely illustrative of the invention, and various configurations other than those stated above can be adopted.

It is apparent that the present invention is not limited to the above embodiment, and may be modified and changed without departing from the scope and spirit of the invention.

What is claimed is:

1. A semiconductor device comprising:
   a substrate;
   a transistor formed in said substrate;
   a multilayer interconnect layer formed over said substrate and said transistor; and
   a capacitive element formed in said multilayer interconnect layer,
   wherein said capacitive element includes
   a lower electrode including a metal,
   a dielectric film, formed over said lower electrode, which is made of a metal oxide film, and
   an upper electrode formed over said dielectric film,
   said lower electrode includes an oxide layer having a thickness of 2 nm or less over the surface layer,
   said dielectric film includes at least a first phase appearing at room temperature in the bulk state and a second phase appearing at a higher temperature than that in said first phase in the bulk state, wherein said first phase is a monoclinic phase, and said second phase is a tetragonal phase, and
   said second phase has a higher relative permittivity than that of said first phase.

2. The semiconductor device as set forth in claim 1, wherein said oxide layer includes said metal of one or more atomic layers.

3. The semiconductor device as set forth in claim 1, wherein said oxide layer has a thickness of 0.5 nm or more.

4. The semiconductor device as set forth in claim 1, wherein said lower electrode is a Ti nitride film or a Ti film.

5. The semiconductor device as set forth in claim 1, wherein said dielectric film is a zirconium oxide film or a hafnium oxide film.

6. The semiconductor device as set forth in claim 1, wherein said dielectric film includes said second phase at equal to or more than 0.2 times that of said first phase.

7. The semiconductor device as set forth in claim 1, wherein said capacitive element is a three-dimensional type capacitive element.

8. The semiconductor device as set forth in claim 1, wherein said capacitive element is a portion of a memory cell.

9. The semiconductor device as set forth in claim 1, wherein said capacitive element is a capacitive element for decoupling.

* * * * *